United States Patent
Wu et al.

(10) Patent No.: US 7,664,614 B2
(45) Date of Patent: Feb. 16, 2010

(54) METHOD OF INSPECTING PHOTOMASK DEFECT

(75) Inventors: Te-Hung Wu, Tainan County (TW); Shih-Ming Yen, Kaohsiung (TW); Chih-Hao Wu, Taoyuan County (TW); Chuen-Huei Yang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 82 days.

(21) Appl. No.: 11/934,524

(22) Filed: Nov. 2, 2007

(65) Prior Publication Data

US 2009/0119045 A1   May 7, 2009

(51) Int. Cl.
*G06F 19/00* (2006.01)
*G06F 17/40* (2006.01)

(52) U.S. Cl. .............. 702/82; 356/237.1; 356/237.2; 356/237.3; 356/237.4; 356/237.5; 382/100; 382/141; 382/144; 382/145; 382/147; 382/148; 382/149; 438/14; 438/16; 702/1; 702/81; 702/127; 702/187; 702/189; 716/1; 716/4; 716/19

(58) Field of Classification Search .............. 702/167, 702/1, 81, 82, 83, 84, 85, 127, 155, 158, 702/159, 166, 164, 182, 187, 189; 73/865.8; 356/2, 237.1, 237.2, 237.3, 237.4, 237.5, 356/600, 625, 626, 630; 382/100, 108, 141, 382/144, 145, 146, 147, 148, 149, 150; 438/14, 438/16; 703/2; 716/1, 4, 19

See application file for complete search history.

(56) References Cited

U.S. PATENT DOCUMENTS

| | | | | |
|---|---|---|---|---|
| 5,886,909 A * | 3/1999 | Milor et al. | ..... | 716/4 |
| 6,023,328 A * | 2/2000 | Pierrat | ..... | 356/237.4 |
| 6,578,188 B1 * | 6/2003 | Pang et al. | ..... | 716/19 |
| 6,771,807 B2 * | 8/2004 | Coulombe et al. | ..... | 382/149 |
| 7,003,755 B2 * | 2/2006 | Pang et al. | ..... | 716/19 |
| 7,383,530 B2 * | 6/2008 | Wang et al. | ..... | 716/21 |
| 7,562,337 B2 * | 7/2009 | Bruce et al. | ..... | 716/21 |
| 2001/0028732 A1 * | 10/2001 | Coulombe et al. | ..... | 382/149 |
| 2003/0126581 A1 * | 7/2003 | Pang et al. | ..... | 716/19 |
| 2004/0225488 A1 * | 11/2004 | Wang et al. | ..... | 703/22 |
| 2005/0226492 A1 * | 10/2005 | Ho | ..... | 382/144 |
| 2007/0250805 A1 * | 10/2007 | Wang et al. | ..... | 716/21 |
| 2008/0141211 A1 * | 6/2008 | Bruce et al. | ..... | 716/19 |

FOREIGN PATENT DOCUMENTS

JP      11-74326 A * 3/1999

* cited by examiner

*Primary Examiner*—Edward R Cosimano
(74) *Attorney, Agent, or Firm*—J.C. Patents

(57) ABSTRACT

A method of inspecting defect of a mask is provided. In this method, a database for storing a plurality of virtual simulation models is created. The virtual simulation models are determined by a plurality of factors including an optical effect and a chemical effect during the transferring the pattern of a mask to the photoresist layer on a wafer. A mask defect image is acquired. A simulation contour of the mask defect image is generated from at least one virtual simulation model in the database. Next, the acceptability of the mask is determined.

13 Claims, 1 Drawing Sheet

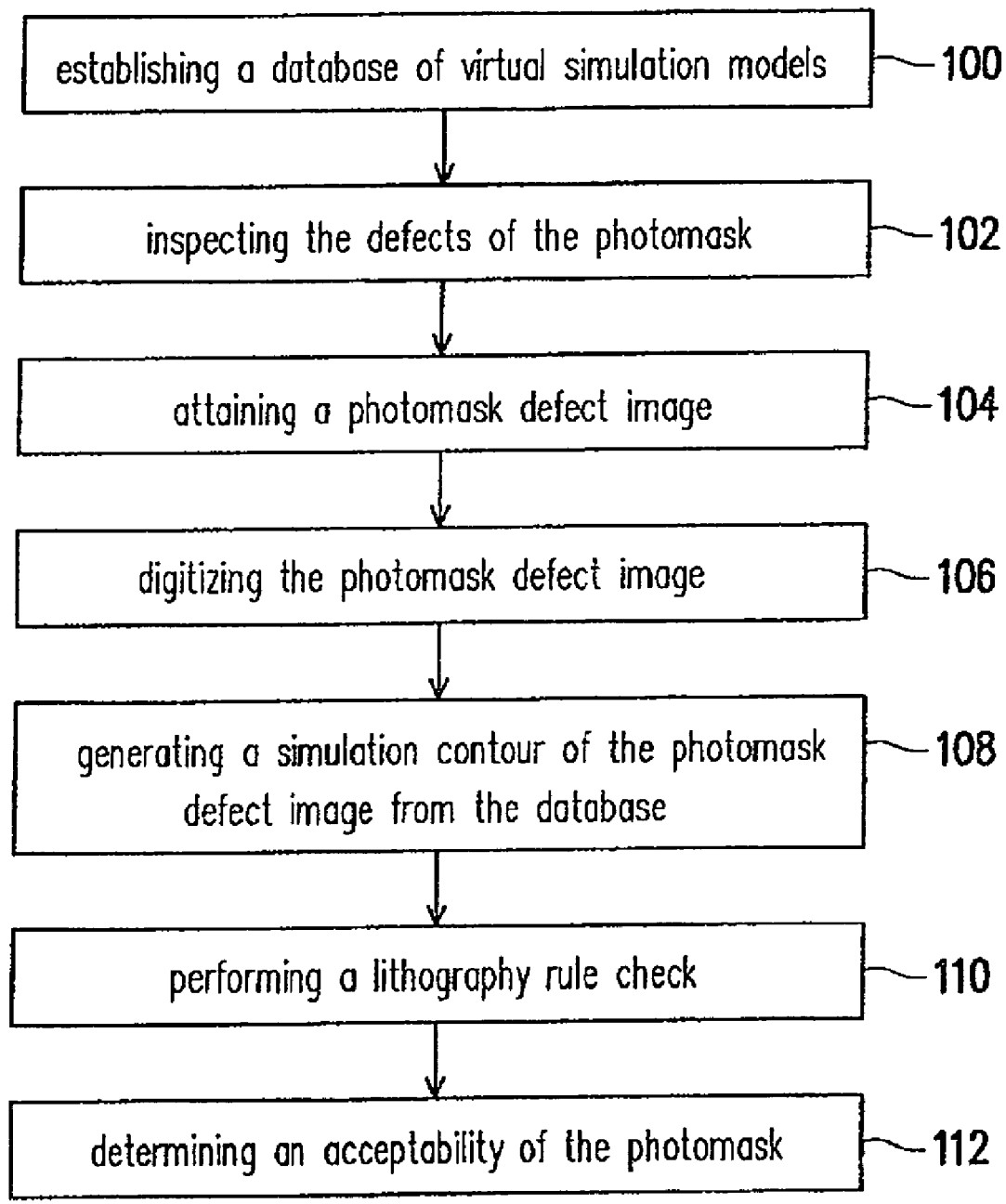
Figure

METHOD OF INSPECTING PHOTOMASK DEFECT

BACKGROUND OF THE INVENTION

1. Field of Invention

The present invention relates to an inspection method. More particularly, the present invention relates to a method of inspecting a photomask defect.

2. Description of Related Art

In the fabrication of integrated circuits, a pattern on a wafer or the various types of material layer on the wafer is formed by a transfer from a photomask pattern. A typical approach is to form a photoresist layer on a wafer, followed by projecting the pattern of the photomask on the photoresist layer via an exposure process. Thereafter, a development process is performed to the required pattern in the photoresist layer. With a subsequent etching process, the pattern in the photoresist layer is transferred to the wafer or the material layer on the wafer.

As the device dimension continues to reduce and integrated circuits become more complicated, it is important to form an accurate pattern on a photomask. The current fabrication techniques of a photomask can not assure the formation of a perfect photomask without defects. Unfortunately, defects are normally present in a newly fabricated photomask; thus, it is necessary to inspect the photomask to determine whether it is acceptable for used, or a repair or a remake of the photomask is required. On the other hand, even the photomask is acceptable for use, it is necessary to subject the photomask to an inspection prior to its use in the patterning of a wafer to ensure the stability of the process and to obviate defects being generated during the process to affect the accuracy of the to-be-formed pattern.

A typical method of inspecting defects on a photomask includes actually forming a photoresist layer on a wafer, followed by performing an exposure-and-development process to transfer the pattern from the photomask to a photoresist layer. Then, by evaluating the pattern in the photoresist layer to determine whether the photomask passes the inspection. However, the conventional approach is very time-consuming and non-economical.

SUMMARY OF THE INVENTION

The present invention is to provide a method for inspecting a defect on a photomask, wherein an actual exposure-and-development process being performed on a wafer can be obviated.

The present invention is to provide a rapid method that can effectively and accurately inspect a defect on a photomask.

The present invention is to provide a method for inspecting a photomask. The method includes establishing a database that stores a plurality of virtual simulation models. The virtual simulation models are established by a calibration process with real silicon data. The photomask defect image is then obtained. Thereafter, a simulation contour of the photomask defect image is generated by the virtual simulation models from the database, and a decision can be made on whether the photomask is acceptable.

According to the above method of inspecting photomask defects of an embodiment of the present invention, the factors to be considered during the process of establishing the virtual simulation models further include the effects of the machine.

According to the above method of inspecting photomask defects of an embodiment of the present invention, the virtual simulation models include a plurality optical proximity effect correction simulation models.

According to the above method of inspecting photomask defects of an embodiment of the present invention, after generating the simulation contour of the photomask defect image, a lithograph rule check is performed.

According to the above method of inspecting photomask defects of an embodiment of the present invention, the lithography rule check includes checking the overlapped contours of the simulation contour of the photomask defect image to the photomask layout of the pre-layer.

According to the above method of inspecting photomask defects of an embodiment of the present invention, the step of determining the acceptability of the photomask is based on the results of the lithograph rule check.

According to the above method of inspecting photomask defects of an embodiment of the present invention, subsequent to attaining the photomask defect image, the photomask defect image is digitized.

According to the above method of inspecting photomask defects of an embodiment of the present invention, the step of generating a simulation contour of a photomask defect image is based on the entire digitized photomask defect image.

According to the above method of inspecting photomask defects of an embodiment of the present invention, the step of generating a simulation contour of a photomask defect image is based on a portion of the digitized photomask defect image.

According to the above method of inspecting photomask defects of an embodiment of the present invention, the step of determining the acceptability of the photomask is based according to the simulation contour of the photomask defect image.

According to the above method of inspecting photomask defects of an embodiment of the present invention, the photomask defect image includes the defect image.

According to the above method of inspecting photomask defects of an embodiment of the present invention, the photomask defect image includes the geometric distribution image and the defect image.

According to the above method of inspecting photomask defects of an embodiment of the present invention, the geometric distribution image includes a geometric distribution image of an optical proximity correction.

According to the above method of inspecting photomask defects of an embodiment of the present invention, the geometric distribution image includes a geometric distribution that has not been corrected by optical proximity correction.

According to the above method of inspecting photomask defects of an embodiment of the present invention, prior to attaining the photomask defect image further includes inspecting the defects of the photomask to obtain the defect image.

According to the above method of inspecting photomask defects of an embodiment of the present invention, prior to attaining the photomask defect image, the defects of the photomask are inspected to obtain the defect image.

According to the above method of inspecting photomask defects of an embodiment of the present invention, the digitized photomask defect image is stored in the database.

According to the above method of inspecting photomask defects of an embodiment of the present invention, the performance of an actual exposure-and-development process on a wafer is not required for inspecting the photomask defects.

According to the above method of inspecting photomask defects of an embodiment of the present invention, whether the defects on the photomask are acceptable or not can be rapidly determined.

The above method of inspecting photomask defects of an embodiment of the present invention is time-preserving, economical and effective.

In order to make the aforementioned and other objects, features and advantages of the present invention comprehensible, a preferred embodiment accompanied with figures is described in detail below.

BRIEF DESCRIPTION OF THE DRAWINGS

The FIGURE is a block diagram illustrating a method of inspecting a photomask defect according to an embodiment of the invention.

DESCRIPTION OF EMBODIMENTS

According to the above method of inspecting a photomask defect of an embodiment of the present invention, to determine whether a photomask is acceptable for use, or is required to be repaired or remade, the conditions of a wafer subsequent to an actual process such as an exposure-and-development process is simulated using the conditions of the actual parameters, such as the exposure, development and baking conditions after the photomask defect image is attained and establishing a database of the simulation models by a calibration process with real silicon data. The details of an embodiment of the present invention are disclosed below.

The FIGURE is a block diagram illustrating a method of inspecting a photomask defect according to an embodiment of the invention.

Referring to the FIGURE, in block 102, the defect of a provided photomask is inspected. The provided photomask can be a photomask newly fabricated by a photomask manufacturer or a photomask that is actually being applied in a process in a semiconductor factory. In step 102, the inspection of the photomask defect is accomplishable by using a inspection machine, via a comparison between wafers or via an evaluation of the interference condition of the light beam through the wafer or via a comparative design database to identify the potential defect on a mask. If the inspection machine detects no defect on a photomask, the photomask passes and the pattern on the photomask can be printed directly on a wafer for the subsequent lithograph process.

If the inspection machine detects a defect on a wafer, an additional step is required to evaluate whether the defect on the photomask can be ignored or the photomask needs to be repaired or remake. Normally, the inspection machine can output the inspected photomask defect image for the inspection engineer. In block 104, subsequent inspection steps are performed. The photomask defect image described in block 104 may include the geometric distribution image and the defect image, or the defect image alone. The geometric distribution image may include the geometric distribution image has not been corrected by optical proximity correction, for example less complicated or less dense integrated circuits, wherein the geometric shapes on the photomask are normally represent the desired electric circuit pattern for its corresponding layer. The geometric distribution image may also be geometric distribution image corrected by optical proximity correction, for example, more complicated and denser integrated circuits, where the size of the circuit feature approaches the optical limits. To compensate for the optical proximity effect, normally a photomask further includes certain optical proximity correction features, such as serif, hammerhead, bias and assist bar. The defect image can be any type of defect image, in which the defect may be in the opaque area or the clear area of the photomask. For example, the defect may be a pinhole defect or an edge protrusion defect in the opaque area, or the defect is a spot defect or an edge intrusion defect in the clear area, or a geometry bridge defect in the opaque area that connects two opaque areas, or a geometry break defect in the clear area that breaks into two parts.

After attaining the photomask defect image, the photomask defect image is digitized into a data file to facilitate the subsequent virtual simulation. In Block 106, the stored data includes the transmittance ratio, the dimension and the shape, etc. of the geometric distribution image. The format of the data file is not limited. Then, the digitized photomask defect image is stored in the database.

Thereafter, in Block 108, the data regarding the digitized photomask defect image and the actual parameters that are going to be implemented subsequently, such as, the parameters of the subsequently performed exposure process, the parameters of the subsequently performed development process and the parameters of the subsequently performed backing process and the differences between machines are input into the image simulation apparatus in order for at least one virtual simulation model in the database of the image simulation apparatus to generate a simulation contour of the photomask defect image. The input data of the digitized photomask defect image can be all of the digitized photomask defect image data on the photomask. The input digitized photomask defect image data can also be a portion of the digitized photomask defect image data, in which a portion of the digitized photomask defect image is selected to serve as a designated simulation region, followed by generating the simulation contour of the photomask defect image according to the designated simulation region.

The input exposure parameters that are input in the database of the image simulation apparatus may include, but not limited to, the NA (numerical aperture) of the exposure system, the coherency value of the exposure system, the wavelength and the dosage of the illumination being used in the exposure system, the defocus of the exposure, lens aberration, the wafer condition, the critical dimensions, etc. The development parameters that are input in the database of the image simulation apparatus may include, but not limited to, the type of developer, the concentration of the developer, the development period and the temperature, etc. The baking parameters that are input in the database of the image simulation apparatus may include the number of times of the baking, the baking temperature and the baking period, etc.

Many sets of the virtual simulation models are stored in the database of the image simulation apparatus. These virtual simulation models are established by a calibration process with real silicon data. In general, the virtual simulation models of the database are established prior to the inspection of the photomask, as in block 100. A method for establishing the virtual simulation models includes adopting a test photomask that has various patterns, and patterning a photoresist layer on a wafer using different exposure lights, development machines in accordance to the different exposure, development and baking parameters. The exposure parameters may include the NA, the coherency value of the exposure system, the wavelength and the power of the illumination being used by the exposure system, the defocus of the exposure, the lens aberration, the wafer condition and the critical dimensions, etc. The development parameters may include, but not limited to, the type of developer, the concentration of the developer, the development period and temperature, etc. The baking parameters may include, but not limited to, the number of times of the baking, the baking temperature and the baking period, etc. Thereafter, the related information regarding the patterned photoresist layer on the wafer is further inspected and is stored to establish a plurality of virtual simulation models. In one embodiment, the virtual simulation models include optical proximity correction simulation models. These simulation models are established by a calibration process, in which data are obtained from a pattern that is actually being transferred from a testing photomask to wafer. Hence, the actual situations occur during the transferring process of a pattern of a photomask to the photoresist layer of a wafer, such as the optical effect, the chemical effect and the machine effect, are all being considered. The optical effect includes, for example, the optical effect includes the influences resulted from, for example, the scattering phenomenon generated when a light beam passes through a photomask, the interference phenomenon when a light beam passes through a photomask having different patterns thereon, the reflection of light due to a non-planar wafer. The chemical effect includes the influences of the development parameters and the baking parameters. The machine effect basically refers to the influences due to the differences in different machines. Accordingly, subsequent to the performance of the virtual simulation, the simulation contour of the photomask defect image generated from the database of the image simulation apparatus can simulate the situations of a pattern of a photomask being transferred to a wafer.

Subsequent to the performance of virtual simulation, the simulation contour of the photomask defect image simulation apparatus generated in the database of the image simulation apparatus can simulate the pattern transferring condition from the photomask to the wafer. Thereafter, according to the generated simulation contour of the photomask defect image, the effects of the defect area on the fabrication process are known to determine the acceptability of the photomask as described in block 112. When the photomask is acceptable, the subsequent lithograph process is performed. However, when the photomask is not acceptable, a repair or a remake of the photomask is performed.

Normally, the defect on the photomask not only may affect the current layer of the wafer, it may affect the previous and the subsequent layers. Hence, after the simulation contour of the photomask defect image is generated, lithograph rule check is first performed as in Block 110. The LRC includes examining the overlapped contours of the simulation image of the photomask defect image of the current layer to the photomask layout of the pre-layer, or examining the overlapped contours of the simulation image of the photomask defect image of the current layer to the photomask layout of the post layer. Thereafter, the acceptability of the photomask based on the results of the lithography rule check is determined.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of inspecting a photomask defect, the method comprising:
    establishing a database storing a plurality of virtual simulation models, the virtual simulation models are established by a calibration process with real silicon data;
    attaining a photomask defect image, wherein after attaining the photomask defect image, the photomask defect image is digitized;
    generating a simulation contour of a photomask defect image based on the virtual simulation models of the database, wherein the step of generating the simulation contour of the photomask defect image is based on at least a portion of the digitized photomask defect image; and
    determining an acceptability of the photomask.

2. The method of claim 1, wherein the factors that determine the virtual simulation models comprise a machine effect.

3. The method of claim 1, wherein the virtual simulation models comprise a plurality of optical proximity correction simulation models.

4. The method of claim 1, wherein the step of determining the acceptability of the photomask is based on the generated simulation contour of the photomask defect image.

5. The method of claim 1, wherein the photomask defect image comprises a defect image.

6. The method of claim 1, wherein prior to the step of attaining the photomask defect image, the photomask defect is inspected to obtain the defect image.

7. The method of claim 1 further comprises storing a digitized photomask defect image in the database.

8. The method of claim 1, wherein after the generation of the simulation contour of the photomask defect image, a lithograph rule check is performed.

9. The method of claim 8, wherein the step of performing the lithography rule check comprises checking overlapped contours of the simulation contour of the photomask defect image to the simulation contour of a photomask layout of a pre-layer or to the simulation contour of a photomask layout of a post layer.

10. The method of claim 9, wherein the step of determining the acceptability of the photomask is based on results of the lithograph rule check.

11. The method of claim 1, wherein the photomask defect image comprises:
    a geometric distribution image; and
    a defect image.

12. The method of claim 11, wherein the geometric distribution image comprises a geometric distribution image corrected by an optical proximity correction.

13. The method of claim 11, wherein the geometric distribution image comprises a geometric distribution image that has not been corrected by an optical proximity correction.

* * * * *